United States Patent [19]

Budd

[11] Patent Number: 5,063,199

[45] Date of Patent: Nov. 5, 1991

[54] METHOD OF DEPOSITING THIN FILMS OF HIGH TEMPERATURE BI-SR-CA-CU-O-BASED CERAMIC OXIDE SUPERCONDUCTORS

[75] Inventor: Kenton D. Budd, Woodbury, Minn.

[73] Assignee: Minnesota Mining and Manufacturing Company, St. Paul, Minn.

[21] Appl. No.: 538,835

[22] Filed: Jun. 15, 1990

[51] Int. Cl.$^5$ ............................ B05D 5/12; B05D 3/02
[52] U.S. Cl. .......................................... 505/1; 505/734;
505/737; 427/62; 427/226; 427/126.3
[58] Field of Search .................... 505/1, 734, 737, 725;
427/62, 63, 226, 126.3

[56] References Cited

U.S. PATENT DOCUMENTS

| | | | |
|---|---|---|---|
| 4,273,826 | 6/1981 | McCollister et al. | 428/304 |
| 4,332,879 | 6/1982 | Pastor et al. | 430/272 |
| 4,920,093 | 4/1990 | Nonaka et al. | 505/1 |

OTHER PUBLICATIONS

Nasu et al., "Formation of High-$T_c$ Superconducting BiSrCaCu$_2$O$_x$ Films on ZrO$_2$/Si(100)", Jpn. J. Appl. Phys., 27(4), Apr. 1988, L634–635.

Hoshino et al., "Preparation of Superconducting Bi-Sr-Ca-Cu-O printed Thick Films on MgO Substrate and Ag Metal Tape", Jpn. J. Appl. Phys., 27(7), Jul. 1988, L1297-1299.

Mei et al., "Thin Films of the Bi$_2$Sr$_2$Ca$_2$Cu$_3$O$_x$ Superconductor", Appl. Phys. Lett., 56(6), Feb. 1990, pp. 581–583.

Tarascon et al., "Crystal Substructure and Physical Properties of the Superconducting Phase Bi$_4$(Sr,Ca)-Cu$_4$O$_{16+x}$", Phys. Rev. B., 37 (16), pp. 9382–9389.

Laibowitz, "High $T_c$ Superconducting Thin Films" (Jan. 1989), M.R.S. Bull., pp. 58–62.

Bunshan et al., "Processing Science and the Technology of High $T_c$ Films" (Jan. 1989), Res. and Dev., pp. 65–79.

Cooper et al., "Bismuth Strontium Calcium Copper Oxide High-$T_c$ Superconducting Films from Nitrate Precursors" (1988), Mat. Lett., 7 (1,2), pp. 5–8.

Furcone et al., "Spiin-On Bi$_4$Sr$_3$Ca$_3$Cu$_4$O$_{16+x}$ Superconducting Thin Films From Citrate Precursors", (1988), Appl. Phys. Lett., 52 (25), pp. 2180–2182.

Nasu et al., "Preparation of BiSrCaCu$_2$O$_x$ Films with $T_c > 77K$ by Pyrolysis of Organic Acid Salts", Jap. J. Appl. Physics (1988), 27 (4), pp. L536–537.

Primary Examiner—Shrive Beck
Assistant Examiner—Roy V. King
Attorney, Agent, or Firm—Gary L. Griswold; Walter N. Kirn; Lorraine R. Sherman

[57] ABSTRACT

This invention provides a method for depositiing a superconducting thin film comprising at least one high temperature Bi-Sr-Ca-Cu-O-based superconductor phase onto a substrate such as, for example, a ceramic oxide or a metal. High temperature Bi-Sr-Ca-Cu-O-based superconductor phases include Bi$_2$Sr$_2$CaCu$_2$O$_8$, Bi$_4$Sr$_3$Ca$_3$Cu$_4$O$_{16}$, and Bi$_2$Sr$_2$Ca$_2$Cu$_3$O$_{10}$.

24 Claims, No Drawings

METHOD OF DEPOSITING THIN FILMS OF HIGH TEMPERATURE BI-SR-CA-CU-O-BASED CERAMIC OXIDE SUPERCONDUCTORS

FIELD OF THE INVENTION

This invention relates to a method for depositing a high temperature superconductor thin film comprising at least one high temperature Bi-Sr-Ca-Cu-O-based ceramic oxide superconductor phase onto a substrate. The method of the present invention is useful in the preparation of microelectronics including, for example, detectors, interconnects, filters, and high speed transistors, as well as high temperature ceramic oxide superconductor-coated fibers.

BACKGROUND ART

High temperature ceramic oxide superconductor compounds known in the art include materials in such systems as Y-Ba-Cu-O, Tl-Ba-Ca-Cu-O, La(Sr, Ba)-Cu-O, Bi-Sr-Ca-Cu-O, as well as related materials.

Several high temperature Bi-Sr-Ca-Cu-O-based ceramic oxide superconductors are known. For example, Tarascon et al. in "Crystal Substructure and Physical Properties of the Superconducting Phase $Bi_4(Sr, Ca)_6Cu_4O_{16+x}$", *Phys. Rev. B.*, 37, (16), 1988, pp. 9382–89, describe the crystal structure and superconductive properties of $Bi_4(Sr, Ca)_6Cu_4O_{16+x}$ and $Bi_2Sr_2CaCu_2O_{8.13}$.

Thin films of high temperature Bi-Sr-Ca-Cu-O-based ceramic oxide superconductors have been deposited onto planar substrates by several techniques. For example, Laibowitz in "High $T_c$ Superconducting Thin Films", *M.R.S. Bull.*, Jan., 1989, pp. 58–62, discusses the deposition of high temperature Bi-Sr-Ca-Cu-O-based ceramic oxide superconductors onto wafer-shaped substrates such as $Al_2O_3$, MgO, $SrTiO_3$, Si, $LaGaO_3$, and $ZrO_2$ stabilized with Y.

Methods known in the art for depositing thin films of high temperature Bi-Sr-Ca-Cu-O-based ceramic oxide superconductors include a variety of conventional vacuum techniques, such as magnetron sputtering, laser evaporation, and co-evaporation. (See e.g., "Processing Science and the Technology of High $T_c$ Films", Bunshah et al., *Res. and Dev.*, Jan., 1989, pp. 65–79.)

Several solution-based techniques for depositing high temperature Bi-Sr-Ca-Cu-O-based ceramic oxide superconductors onto substrates such as $ZrO_2$, MgO, and $SrTiO_3$, are also known in the art. For example, Cooper et al. in "Bismuth Strontium Calcium Copper Oxide High-$T_c$ Superconducting Films From Nitrate Precursors," *Mat. Lett.*, 7, (1,2), 1988, pp. 5–8, teach a superconducting film of bismuth strontium calcium cuprate prepared by spray pyrolysis of aqueous nitrate solutions onto heated (100) oriented MgO, yttria-stabilized zirconia, and $SrTiO_3$ substrates. Although spray pyrolysis allows greater flexibility in the choice of precursor chemistry than other known solution-based techniques, the process requires spraying a precusor solution onto a heated substrate (typically heated to a temperature in the range of 400° to 600° C.), atomization of the precursor solution, and careful control of the impingement velocity of the atomized precursor solution.

Furcone et al. in "Spin-on $Bi_4Sr_3Ca_3Cu_4O_{16+x}$ Superconducting Thin Films From Citrate Precursors," *Appl. Phys. Lett.*, 52, (25), 1988, pp. 2180–82, describe the synthesis of thin films in the Bi-Sr-Ca-Cu-O system from homgeneous liquid citrate precursors coated on to single-crystal $SrTiO_3$, Y-stabilized cubic $ZrO_2$, and (100) oriented MgO substrates by spin-coating and heat-treatment methods. The authors noted, however, that the viscosity of their precursor solution, which was highly variable, was dependent on the thermal history and the specific yield of the solution.

Nasu et al. in "Preparation of $BiSrCaCu_2O_x$ Films with $T_c > 77$ K by Pyrolysis of Organic Acid Salts," *Jap. J. Appl. Physics*, 27, (4), 1988, pp. L536–37, disclose the preparation of a high temperature superconducting $BiSrCaCu_2O_x$ film on yttria-stabilized zirconia substrates using bismuth, strontium, calcium, and copper 2-ethylhexanoate precursors.

EPO Patent Application No. 0 287 258 describes a method for forming a cuprate-based high temperature ceramic oxide superconductive layer on a substrate, such as MgO, $ZrO_2$, $SrTiO_3$, Au, or Ag, by applying a precursor solution onto a major surface of the substrate, (e.g., by spraying, dipping, spin-casting), heating the coated substrate to a temperature in the range of 400° to 450° C., heating the substrate in an oxygen atmosphere to a temperature in the range of 820° to 1000° C. such that the perovskite phase associated with superconductivity in $YBa_2Cu_3O_7$ is formed, and then oxygenating the perovskite phase in an oxygen atmosphere at a temperature in the range of 300° to 500° C. The preferred cuprate-high temperature ceramic oxides disclosed were represented by the generalized formulas, $$Ba_{2-x}M_{1-y}X_{x+y}Cu_3O_{9-\delta},$$

wherein M is one of Y, Eu, or La; X is none or one or more of Ba, Y, Eu, La, Ce, Pr, Nd, Pm, Sm, Eu, Gd, Tb, Dy, Ho, Er, Tm, Yb, Lu, Sc, Ca, and Sr; $0 \leq x+y \leq 1$; and $1.5 < \delta < 2.5$; and $$La_{2-x}M_xCuO_{4-\epsilon},$$

wherein M is one or more divalent metals such as Ba, Sr, and La; $x \geq 0.05$; and $0 \leq \epsilon \leq 0.5$. The authors, however, do not teach a method for depositing a high temperature Bi-Sr-Ca-Cu-O-based ceramic oxide superconductive phase onto a substrate.

SUMMARY OF THE INVENTION

Briefly, the present invention provides a method for depositing a thin film of a high temperature Bi-Sr-Ca-Cu-O-based ceramic oxide superconductor comprising the step of heating an article comprising a substrate having coated on at least a portion thereof a liquid precursor of a high temperature Bi-Sr-Ca-Cu-O-based ceramic oxide superconductor, the liquid precursor comprising a solvent, copper acrylate, strontium acrylate, bismuth nitrate, and calcium nitrate, to a temperature and for a time sufficient to provide a thin film comprising at least one high temperature Bi-Sr-Ca-Cu-O-based ceramic oxide superconductor phase, wherein the solvent is a polar non-aqueous solvent having a boiling point higher than water, and wherein the copper acrylate, strontium acrylate, bismuth nitrate, and calcium nitrate are mutually soluble in the solvent.

It is known in the art that solution-based deposition methods for depositing high temperature ceramic oxide superconductors generally offer better compositional control and are more economical than vacuum-based techniques. Further, a solution-based method allows uniform deposition of a high temperature ceramic oxide superconductor onto a substrate having a complex shape.

Substrates useful in preparing articles according to the method of the present invention include ceramics (i.e., oxide and non-oxide ceramics), metalloids, and metals.

The high temperature ceramic oxide superconductor liquid precursor of the present invention may be applied at ambient temperatures by application techniques known in the art including, for example, dip-coating, spray-coating, or spin-casting.

The method of the present invention utilizes a liquid precursor solution comprised of an admixture of precursor salts or compounds which are easily dissolved in a solvent over a wide concentration range; allows deposition of multiple layers of a high temperature Bi-Sr-Ca-Cu-O-based ceramic oxide superconductor precursor without dissolution of previous layers; and provides a thin film of a high temperature Bi-Sr-Ca-Cu-O-based ceramic oxide superconductor having zero electrical resistance at higher temperatures than solution-based methods known in the art.

The viscosity of the liquid precursor according to the present invention is predictable in the sense that multiple batches having the same formulation exhibit comparable viscosities. Further, the viscosity of the liquid precusor does not significantly change with time.

In this application:

"thin film" means a layer having a thickness up to 10 micrometers;

"superconductor" means a material which has zero electrical resistance below a critical temperature;

"high temperature ceramic oxide superconductor" means a ceramic oxide material comprising at least one oxide phase which exhibits superconductivity above 23K;

"deposit" means coating a precursor of a high temperature ceramic oxide superconductor onto a substrate, and then heating the coated precursor to a temperature, for a time, and in an atmosphere sufficient to provide at least one high temperature ceramic oxide superconductor phase;

"high temperature Bi-Sr-Ca-Cu-O-based ceramic oxide superconductor" means a high temperature ceramic oxide superconductor in the system represented by, (Bi, E)-Sr-Ca-Cu-O, wherein E is none or at least one element selected from the group consisting of Pb and Sb;

"alkoxyalkanol" means a solvent represented by the general formula, $R^1OR^2OH$, wherein $R^1$ is an alkyl group preferably comprising 1 to 4 carbon atoms and $R^2$ is an alkylene group (i.e., divalent $C_nH_{2n}$, wherein n is an integer from 1 to 4) preferably comprising 1 to 4 carbon atoms; and "pyrolyzing" means heating to a temperature and for a time sufficient to thermally decompose a precursor and drive off a substantial portion of fugitive substituents.

The art does not disclose or suggest the method of the present invention for depositing a thin film comprising at least one high temperature Bi-Sr-Ca-Cu-O-based ceramic oxide superconductor onto a substrate.

DETAILED DESCRIPTION OF PREFERRED EMBODIMENTS

The preferred solvent for preparing the liquid precursor comprising copper acrylate, strontium acrylate, bismuth nitrate, and calcium nitrate is an alkoxyalkanol. Most preferably, the solvent is methoxyethanol.

Copper acrylate and strontium acrylate may be prepared by methods known in the art. Copper acrylate, for example, may be prepared by reacting $CuCO_3 \cdot Cu(OH)_2$ with acrylic acid in water and then removing the solvent. Strontium acrylate, for example, may be prepared by suspending SrO in methoxyethanol and then dropwise adding 2 moles of acrylic acid per mole of SrO. Calcium and bismuth nitrates are commercially available.

Preferably, the liquid precursor contains little or no water. The presence of water tends to cause undesirable insoluble bismuth compounds to form. Water present in a component of the liquid precursor, such as a copper acrylate solution, a strontium acrylate solution, a calcium nitrate solution, a bismuth nitrate solution, or a combination thereof may be removed by known techniques including, for example, partial vacuum evaporation.

Preferably, the cation (i.e., Bi, Pb, Sb, Sr, Ca, and Cu) concentration of the liquid precursor is in the range of 0.01 to 5 moles per kilogram of solution. More preferably, the cation concentration is in the range of 0.1 to 1 mole per kilogram of solution.

The preferred ratio of cations (i.e., [Bi,E]:Sr:Ca:Cu:O) in the liquid precursor is that corresponding to the ratio of cations in the desired high temperature Bi-Sr-Ca-Cu-O-based ceramic oxide superconductor, wherein E is none or at least one of Pb and Sb.

It is known in the art that the chemistry and decomposition characteristics of a high temperature ceramic oxide superconductor liquid precursor may affect the superconducting properties of the resulting high temperature ceramic oxide superconductor. For example, Nasu et al. in "High $T_c$ Superconducting $Ba_2YCu_3O_y$ Films Prepared By Pyrolysis of Organic or Inorganic Acid Salts", Seraminkusu Ronbunshi, 96, (61), 1988, pp. 710-13, prepared high temperature $YBa_2Cu_3O_7$ superconductor thin films from several different precursors (i.e., acetates, nitrates, 2-ethylhexanoates, and stearates and napthenates), each having different chemistries and decomposition characteristics, and found significant differences in the temperature at which zero electrical resistance was observed.

While not wanting to be bound by theory, it is believed that differences in the retention of residual carbon in high temperature Bi-Sr-Ca-Cu-O-based ceramic oxide superconductors, in combination with other factors, which may include, for example, nucleation rates, crystal growth rates, nucleation and growth temperatures, and formation of intermediate or second phases, may result in significantly different superconducting characteristics. The liquid precursor of the present invention contains relatively small amounts of fugitive organic groups. The presence of the nitrate groups in the liquid precursor may act as an internal oxidant and aid in the removal of organic substituents.

A substrate useful in the method of the present invention should be capable of withstanding the temperatures required in the deposition process.

It is desirable that the substrate and the high temperature ceramic oxide superconductor be thermally compatible such that their thermal expansion coefficients are sufficiently similar to prevent cracking or spalling during heating or cooling. Preferably, the substrate and the high temperature ceramic oxide superconductor are crystallographically compatible such that the lattice parameters (i.e., atomic spacing) and crystal structure of the substrate promote formation of a high temperature ceramic oxide superconductor phase.

Preferably, the substrate is a ceramic (i.e., an oxide or non-oxide ceramic), metalloid or metal. More preferably the substrate is $SrTiO_3$ or Si, and most preferably it is MgO, $ZrO_2$, Ag, or Ni.

It is within the scope of this invention to deposit a high temperature Bi-Sr-Ca-Cu-O-based ceramic oxide superconductor according to the method of the present invention onto another high temperature superconductor (i.e., oxide or non-oxide high temperature superconductor).

The substrate may be in any shape or configuration known in the art including, for example, a wafer, a fiber, a rod, a wire, or a wire-like substrate. The preferred substrate shape in preparing articles according to the method of the present invention is a wafer.

The liquid precursor according to the present invention may be coated onto a substrate using techniques known in the art including, for example, dip-coating, spray-coating, or spin-casting. Preferably, the liquid precursor is applied by spin-casting.

The preferred rotational speed for spin-casting is that which is sufficient to form a thin film of the liquid precursor. The rotational speed may be chosen to provide a desired drying rate of the liquid precursor. The maximum rotational speed may be limited by the capability of the equipment or the structural integrity of the substrate. In some embodiments, the maximum rotational speed may be limited by the desired thickness of the precursor layer.

Preferably, the equivalent dry thickness of the high temperature Bi-Sr-Ca-Cu-O-based ceramic oxide superconductor liquid precursor layer coated onto the substrate is less than 2.0 micrometers. More preferably, the equivalent dry thickness of the liquid precursor layer is less than 1.0 micrometer.

The coated liquid precursor may be dried prior to heating to a temperature sufficient to pyrolyze it. Such drying may be accomplished by conventional techniques, including, for example, evaporation under ambient conditions, accelerated evaporation through the use of heat or increased air velocity, and the like.

In a preferred method, the coated liquid precursor is dried, pyrolyzed, and then further heated to a temperature sufficient to provide at least one high temperature ceramic oxide superconductor phase. The preferred pyrolyzing temperature is between 300° and 700° C. The preferred temperature for providing the high temperature ceramic oxide superconductor according to the invention is in the range of 750° to 950° C.

Preferably, up to 50 layers of the liquid precusor are applied to the substrate, wherein each layer is pyrolyzed prior to applying an additional layer. More preferably, between 3 and 25 layers of the liquid precursor are applied to the substrate, each layer being pyrolyzed prior to applying an additional layer. The formulation of the liquid precursor used in coating the additional layers may be the same or different.

Preferably, the total thickness of the thin film comprising at least one high temperature Bi-Sr-Ca-Cu-O-based ceramic oxide superconductor is in the range of 0.1 to 10 micrometers. More preferably, the total thickness of the thin film is in the range of 0.5 to 5 micrometers.

It is recognized by one skilled in the art that the ratio of components present in a high temperature Bi-Sr-Ca-Cu-O-based ceramic oxide superconductor may not correspond exactly to a specific compound. In such cases, a plurality of compounds may result which may include both superconducting and non-superconducting phases. The ratio of the components, however, needs to be such that at least one high temperature Bi-Sr-Ca-Cu-O-based ceramic oxide superconductor phase is formed.

The preferred high temperature Bi-Sr-Ca-Cu-O-based ceramic oxide superconductor compounds are $Bi_2Sr_2CaCu_2O_8$, $Bi_4Sr_3Ca_3Cu_4O_{16}$, and $Bi_2Sr_2Ca_2Cu_3O_{10}$. Use of the chemical formulas above and herein is not intended to exclude phases or compounds exhibiting minor deviations in stoichiometry with respect to the ideal formula.

High temperature Bi-Sr-Ca-Cu-O ceramic oxide superconductors according to the invention may contain Pb or Sb. For example, up to 25 mole percent of the Bi comprising high temperature Bi-Sr-Ca-Cu-O superconductors such as $Bi_2Sr_2CaCu_2O_8$, $Bi_4Sr_3Ca_3Cu_4O_{16}$, or $Bi_2Sr_2Ca_2Cu_3O_{10}$, may be substituted with Pb.

Thin films deposited by the method of the present invention may comprise more than one high temperature Bi-Sr-Ca-Cu-O-based ceramic oxide superconductor phase.

Preferably, high temperature Bi-Sr-Ca-Cu-O-based ceramic oxide superconductor thin films prepared according to the present invention exhibit zero electrical resistance at temperatures up to at least 89K. A zero point temperature of greater than 77K allows the use of liquid nitrogen rather than liquid helium to cool the superconductor to below its superconducting transition endpoint. It is significantly cheaper to cool a material with liquid nitrogen than with liquid helium.

High temperature ceramic oxide superconductors may be susceptible to degradation by exposure to atmospheric components such as $H_2O$ and $CO_2$. A protective coating may be applied to the heat-treated composite article produced by the method of the present invention to prevent or minimize environmental damage to the superconducting properties of the article. The use of such protective coatings, which may be, for example, glass (e.g., silica), is known in the art.

The method of the present invention is useful in the preparation of microelectronics including, for example, detectors, interconnects, filters, and high speed transistors.

A particularly useful article which can be prepared by the method of the present invention is described in assignee's co-pending patent application, U.S. Ser. No. 07/445,385, filed Dec. 4, 1989, wherein high temperature Bi-Sr-Ca-Cu-O-based ceramic oxide superconductors were deposited on flexible zirconia fibers. These superconductor-coated fibers are useful for applications which require the transport or storage of electrical energy.

Objects and advantages of this invention are further illustrated by the following examples, but the particular materials and amounts thereof recited in these examples, as well as other conditions and details, should not be construed to unduly limit this invention. All parts and percentages are by weight unless otherwise indicated.

EXAMPLE 1

A liquid precursor solution comprising copper acrylate, strontium acrylate, calcium nitrate, and bismuth nitrate in methoxyethanol was prepared, with a Bi:Sr:Ca:Cu ratio of 2:2:1:2. The total cation concentration of the liquid precursor was 1 mole per Kg of solution. A 0.5 molal aqueous solution of copper acrylate and a 0.5 molal aqueous solution of strontium acrylate were prepared by reacting the requisite amounts of SrO and $CuCO_3 \cdot Cu(OH)_2$ with acrylic acid. Non-aqueous solutions were formed by diluting each with 2 parts methoxyethanol and concentrating to the original volume with a rotary evaporator. This dilution-concentration step was repeated once.

Solutions of 0.5 molal bismuth nitrate and 0.5 molal calcium nitrate were prepared by dissolving the requisite amount of nitrate powders in methoxyethanol. Approximately 25 percent of the solvent of each solution was removed by rotary evaporation to eliminate water originating as crystalline water in the nitrate salts.

Solutions were combined to give a Bi:Sr:Ca:Cu ratio of 2:2:1:2. The resulting liquid precursor was then concentrated by rotary evaporation to give 1 mole of total cations per kg of solution.

The liquid precursor was spin-cast onto a 1 cm×1 cm×0.5 cm (100) oriented, polished single crystal MgO substrate (Electronic Space Products, Inc.; Agoura, CA) in the following manner. The substrate was mounted onto the sample platform of a photo-resist spinner (Headway Research, Inc.; Garland, TX). The top surface of the substrate was cleaned, while spinning, with alcohol.

The liquid precursor was syringed through a 0.22 micrometer polytetrafluoroethylene filter onto the MgO substrate in an amount sufficient to flood the surface. The substrate with the flood of liquid precursor was spun at a speed of 2000 rpm for about 40 seconds. After spin-coating, the coated substrate was heated in a conventional furnace at 550° C. for about 1 to 2 minutes. The flooding, spin-casting, and heating steps were repeated 17 times. The composite was then cut in half to provide Sample 1 and Sample 2.

Sample 1 was heated in air to a temperature of about 825° C. for about 1 hour using a conventional furnace.

The flooding, spincasting, and heating steps were repeated 7 more times on Sample 2. Sample 2 was then heated in air at about 845° C. for about 1 hour.

Electrical resistivity measurements were made on Sample 1 using indium contacts and a four-point probe technique as described, for example, by X.D. Chen in "Practical Preparation of Copper Oxide Superconductors," *Rev. Sci. Instrum.*, 58, (9), Sept., 1987, pp. 1565–71. The sample was cooled by immersion in the vapor above a reservoir of liquid helium. A current of about 0.1 microampere was applied to the sample. Zero resistance was observed for Samples 1 and 2 at about 83K and 76K, respectively.

EXAMPLE 2

Example 2 was prepared in the same manner as described in Example 1 except the flooding, spin-casting, and heating steps were conducted 20 times and was heat-treated at a temperature of about 880° C. for about 5 hours.

The electrical resistivity was measured using the same technique described in Example 1. At about 89K there was zero electrical resistance.

Conventional x-ray diffraction techniques were used to identify the superconducting thin film as a highly oriented, monophasic $Bi_2Sr_2CaCu_2O_8$, wherein the c-axis was perpendicular to the substrate surface on which the thin film was deposited.

EXAMPLE 3

Example 3 was prepared in the same manner as described in Example 2 except the substrate was a polished, (100) oriented single crystal yttria stabilized zirconia (Ceres Corp; North Bilerica, MA) and was heat-treated at a temperature of about 825° C. for about 2 hours.

The electrical resistivity was measured using the same technique described in Example 1. At about 70K the electrical resistivity was zero.

EXAMPLE 4

Example 4 was prepared in the same manner as described in Example 2, except the ratio of the cations (Bi:Sr:Ca:Cu) comprising the liquid precursor was 4:3:3:4 and the example was heat-treated at a temperature of about 880° C. for about 5 hours.

The electrical resistivity was measured using the same technique described in Example 1. The electrical resistivity was zero at about 85K.

EXAMPLE 5

Example 5 was prepared in the same manner described in Example 2, except the ratio of the cations (Bi:Sr:Ca:Cu) comprising the liquid precursor was 2:2:2:3 and the example was heat-treated at a temperature of about 840° C. for about 1 hour.

The electrical resistivity was determined in the same manner as described in Example 1. At about 79K the electrical resistance was zero.

EXAMPLE 6

Example 6 was prepared in the same manner as described in Example 2, with the following exceptions. A lead nitrate solution was prepared in the same manner as described in Example 1 for the preparation of the bismuth nitrate solution except lead nitrate was used in place of a portion of bismuth nitrate. The nitrate and acrylate solutions were combined to give a cation ratio (Bi:Pb:Sr:Ca:Cu) of 0.7:0.3:1:1:1.8. The example was heat-treated at a temperature of about 845° C. for about 100 hours.

The electrical resistivity was determined in the same manner as described in Example 1. At about 79K there was zero electrical resistance.

EXAMPLE 7

Samples 3 and 4 of Example 7 were prepared in the same manner as described in Example 2, except the substrates were 1 cm×1 cm×1 cm pieces of silver (ALFA Chemicals; Danvers, MA) and nickel (ALFA Chemicals), respectively, and were heat-treated at a temperature of about 810° C. for about 5 hours.

Conventional x-ray diffraction techniques were used to identify the thin film as a highly oriented, nearly monophasic $Bi_2Sr_2CaCu_2O_8$.

EXAMPLE 8

A dip-coating method was used to deposit a thin film of $Bi_2Sr_2CaCu_2O_8$ on a bundle of about 100 to 300 zirconia fibers.

The liquid precursor used in the dip-coating method of Example 8 was prepared in the same manner as described in Example 1. The liquid precursor was diluted to 12.5% of the original concentration with methanol and poured into a vial for dipping.

The 10.2 cm (4 inch) long fibers were prepared as described in Example 1 of assignee's copending patent application Ser. No. 07/286,654 now U.S. Pat. No. 4,937,212, which method is incorporated herein by reference. The zirconia fibers comprised 4 weight percent $Y_2O_3$ and were fired at 1100° C. The diameters of the fibers were 10 to 25 micrometers.

A bundle of the zirconia fibers was dipped in the liquid precursor and blotted on filter paper to remove excess liquid. The remaining coating was pyrolyzed in air by placing it in a box furnace preheated to 550° C. The bundle was flexed by hand to separate bridged areas. After 5 to 10 dipping and heating cycles, the fibers were dark gray to black in color.

After 60 dipping and heating cycles, the bundle was heated in air at 825° C. for 3 hours. The resulting bundle of coated fibers was generally black in color, with yellowish tinges near the center of the bundle. The thickness of the high temperature ceramic oxide superconductor coated on the fibers ranged from 0.5 to 3 micrometers. The fired bundle had occasional bridged areas. A 2.5 cm (1 inch) section of the bundle of coated fibers was bent into a 2.5 cm diameter arc with little or no breakage.

A portion of the bundle was mounted onto a thin alumina plate with four evenly spaced drops of silver conductor paint. Electrical resistivity measurements were made on the coated bundle using a four point probe technique as described in Example 1. At 50K there was zero electrical resistance.

Various modifications and alterations of this invention will become apparent to those skilled in the art without departing from the scope and spirit of this invention, and it should be understood that this invention is not to be unduly limited to the illustrative embodiments set forth herein.

I claim:

1. A method comprising the steps of
   (a) preparing a liquid precursor of a Bi-Sr-Ca-Cu-O-based ceramic oxide superconductor phase, wherein said liquid precursor comprises an alkoxyalkanol, copper acrylate, strontium acrylate, bismuth nitrate, and calcium nitrate, wherein said liquid precursor has a cation ratio sufficient to form the desired stoichiometry in said ceramic oxide superconductor phase when said liquid precursor is heated to a temperature and for a time sufficient to provide said desired ceramic oxide superconductor phase, and wherein said copper acrylate, strontium acrylate, bismuth nitrate, and calcium nitrate are mutually soluble in said alkoxyalkanol;
   (b) applying said liquid precursor to a substrate, wherein said substrate is one of an oxide ceramic, a metal selected from the group consisting of Ag and Ni, and Si; and
   (c) heating said substrate in an oxygen-containing atmosphere with said liquid precursor applied thereon to a temperature and for a time sufficient to form a thin film comprising at least one Bi-Sr-Ca-Cu-O-based high temperature ceramic oxide superconductor phase.

2. The method according to claim 1 wherein said alkoxyalkanol is methoxyethanol.

3. The method according to claim 1 wherein said coated liquid precursor is dried prior to said heating.

4. The method according to claim 1 wherein said liquid precursor is pyrolyzed prior to said heating.

5. The method according to claim 1 wherein up to 50 layers of said liquid precursor are applied to said substrate, with the proviso that each liquid precursor layer is pyrolyzed prior to application of a subsequent liquid precursor layer.

6. The method according to claim 1 wherein between 3 and 25 layers of said liquid precursor are applied to said substrate, with the proviso that each liquid precursor layer is pyrolyzed prior to application of a subsequent liquid precursor layer.

7. The method according to claim 1 wherein said oxide ceramic is selected from the group consisting of $ZrO_2$, MgO, and $SrTiO_3$.

8. The method according to claim 1 wherein said liquid precursor is applied by dip-coating.

9. The method according to claim 1 wherein said liquid precursor is applied by spin-casting.

10. The method according to claim 1 wherein said liquid precursor is applied by spray-coating.

11. The method according to claim 1 wherein said heating temperature is between 750° and 950° C.

12. The method according to claim 5 wherein said pyrolyzing temperature is between 300° and 700° C.

13. The method according to claim 1 wherein said high temperature Bi-Sr-Ca-Cu-O-based ceramic oxide superconductor phase is $Bi_2Sr_2CaCu_2O_8$.

14. The method according to claim 1 wherein said high temperature Bi-Sr-Ca-Cu-O-based ceramic oxide superconductor phase is $Bi_4Sr_3Ca_3Cu_4O_{16}$.

15. The method according to claim 1 wherein said high temperature Bi-Sr-Ca-Cu-O-based ceramic oxide superconductor phase is $Bi_2Sr_2Ca_2Cu_3O_{10}$.

16. The method according to claim 1 wherein said thin film comprising at least one high temperature Bi-Sr-Ca-Cu-O-based ceramic oxide superconductor phase exhibits zero electrical resistance up to at least 23K.

17. The method according to claim 1 wherein said thin film comprising at least one high temperature Bi-Sr-Ca-Cu-O-based ceramic oxide superconductor phase exhibits zero electrical resistance up to at least 77K.

18. The method according to claim 1 wherein said thin film comprising at least one high temperature Bi-Sr-Ca-Cu-O-based ceramic oxide superconductor phase exhibits zero electrical resistance up to at least 89K.

19. The method according to claim 1 wherein said thin film after said heating has a thickness in the range of 0.1 to 0.5 micrometer.

20. The method according to claim 5 wherein said precursor of each of said applied precursor layers is the same.

21. The method according to claim 5 wherein when more than one precursor layer is used, at least one is of different composition from the others.

22. The method according to claim 1 wherein said liquid precursor is pyrolyzed during said heating.

23. The method according to claim 1 wherein said thin film after said heating has a thickness in the range of 0.1 to 5 micrometers.

24. The method according to claim 1 wherein said liquid precursor further comprises lead nitrate, and wherein said Bi-Sr-Ca-Cu-O-based ceramic oxide superconductor is a (Bi, Pb)-Sr-Ca-Cu-O-based high temperature ceramic oxide superconductor.

* * * * *

UNITED STATES PATENT AND TRADEMARK OFFICE
CERTIFICATE OF CORRECTION

PATENT NO. : 5,063,199
DATED : November 5, 1991
INVENTOR(S) : Kenton D. Budd

It is certified that error appears in the above-identified patent and that said Letters Patent is hereby corrected as shown below:

On the title page:
Under OTHER PUBLICATIONS, after Furcone et al., "Spiin-On" should read --"Spin-On--.

Signed and Sealed this

Twenty-ninth Day of June, 1993

Attest:

MICHAEL K. KIRK

Attesting Officer

Acting Commissioner of Patents and Trademarks